United States Patent [19]
Bakhmutsky

[11] Patent Number: 5,973,627
[45] Date of Patent: Oct. 26, 1999

[54] VARIABLE LENGTH DECODER WITH ADAPTIVE ACCELERATION OPTIMIZED BY SUB-GROUPING AND CROSS-GROUPING THE SYMBOLS HAVING THE HIGHEST PROBABILITY OF OCCURRENCE

[75] Inventor: Michael Bakhmutsky, Spring Valley, N.Y.

[73] Assignee: Philips Electronics North America Corporation, New York, N.Y.

[21] Appl. No.: 08/919,972

[22] Filed: Aug. 28, 1997

[51] Int. Cl.[6] ........................................................ H03M 7/40
[52] U.S. Cl. .................................................................. 341/67
[58] Field of Search ........................................... 341/65, 67

[56] References Cited

U.S. PATENT DOCUMENTS

| | | | |
|---|---|---|---|
| 5,173,695 | 12/1992 | Sun et al. .................................... | 341/67 |
| 5,650,905 | 7/1997 | Bakhmutsky .............................. | 341/67 |
| 5,657,016 | 8/1997 | Bakhmutsky .............................. | 341/67 |
| 5,668,548 | 9/1997 | Bakhmutsky .............................. | 341/67 |
| 5,808,570 | 9/1998 | Bakhmutsky .............................. | 341/67 |

*Primary Examiner*—Howard L. Williams
*Attorney, Agent, or Firm*—Laurie E. Gathman

[57] ABSTRACT

A variable length decoder with adaptive acceleration in processing of an encoded input bit stream which includes an input section which receives the input bit stream and provides a decoding window that includes a sequence of bits which include one or more code words to be decoded at an output thereof. A code word length decoding section determines the combined length of a combination of two or more code words received from the input section in response to a first value of a control signal and generates a combined length signal representative of the determined combined length, and determines the length of an individual code word received from the input section in response to a second value of the control signal, and generates an individual code word length signal representative of the determined length of the individual code word. A computation loop section receives the combined length signal or the individual word length signal from the code word length decoding section and, in response thereto, shifts the decoding window to provide a new sequence of bits that include one or more additional code words to be decoded at the output of the input section. A code word value decoding section decodes the values of the combination of two or more code words provided by the input section in response to the first value of the control signal, and decodes the value of the individual code word in response to the second value of the control signal. A control section generates the control signal and controls the operation of the variable length decoder according to a decoding protocol (e.g., MPEG-2). The two or more code words of the combination of code words are part of a sub-grouped and cross-grouped set of code words of a selected group of M code words in the input bit stream whose bit lengths are $\leq$ than a prescribed number N. Less than all possible combinations of the selected group of M code words are stored as entries in a look-up table, so that the total number of combinations of the selected group of M code words which are stored as entries in the look-up table is less than $M^2$.

20 Claims, 13 Drawing Sheets

$S_2 = 2$
$S_3 = 1$
$S_4 = 1$
$S_{23} = 3$ $S_{23}$ | 2 | 3
$S_4$ | 4
— 5

$N = 4$ $LMIN = 3.5$ $CLK = 83.84$ MHz $COMB_{NCG} = (S_{23} + S_4)^2 = 16.$ $COMB_{CG} = S_{23}^2 +$
$(S_2 + S_4)^2 - S_2^2 - S_4^2 +$
$S_{23}^2 + 2S_2S_4 = 13.$

FIG. 6

N = 4
LMIN = 3.5
CLK = 83.84 MHz
COMB$_{NCG}$ = 16
COMB$_{CG}$ = 13
IMPR = 18.8%

VARIABLE LENGTH DECODER WITH ADAPTIVE ACCELERATION OPTIMIZED BY SUB-GROUPING AND CROSS-GROUPING THE SYMBOLS HAVING THE HIGHEST PROBABILITY OF OCCURRENCE

BACKGROUND OF THE INVENTION

The present invention relates generally to variable length decoders (VLDs) used in data transmission systems, and more particularly, to a variable length decoder with adaptive acceleration in processing of Huffman encoded bit streams (such as compressed digital video bit streams) whose basic architecture is essentially the same as the one disclosed in U.S. Pat. No. 5,650,905, which issued on Jul. 22, 1997 to the present inventor (Michael Bakhmutsky), and which is assigned to the present assignee and is incorporated herein by reference, but which achieves improved performance and further cost reduction by sub-grouping and then cross-grouping certain DCT (Discrete Cosine Transform) coefficients based on their bit length.

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams consisting of variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs to the VLD bit segments normally equal in length to the maximum length code word in the bit stream. These bit segments are written into cascaded latches. The cascaded bit segments in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, for example, where the peak symbol rate is about 100 million code words per second, decoding the whole picture at the symbol rate with a single VLD becomes impractical. In HDTV systems, the VLD must be able to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol, a VLD throughput of 100 million or more code words per second is required.

In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers may be required between all of the VLDs and the rate buffer, thereby dramatically increasing the amount of bit stream memory required for the system. For example, a partitioned decoding system having eight parallel VLDs may require eight ping-pong buffers, each one of the ping-pong buffers being twice the size of the rate buffer, thereby increasing the amount of required buffer memory by a factor of sixteen over a system having a single VLD.

In HDTV systems, the input bit stream is normally an MPEG digital video data stream which includes payload data and setup data. The payload data, which constitutes the overwhelming majority of the data (about 95% of the data), is represented by contiguous code words such as DCT (discrete cosine transform) coefficients and motion vectors, which are decoded using their respective look-up tables. The setup data, which constitutes the remaining portion of the data (about 5% of the data), is represented by singular code words which are decoded using different look-up tables. Statistically speaking, most of the HDTV material can be decoded without quality degradation using a basic VLD configuration, such as the one disclosed in U.S. Pat. No. 5,173,695. However, if such a VLD is not capable of operating at a peak symbol rate (PSR) (which is very difficult to achieve in the current VLSI technology), the pictures that do carry too much data to processed in the limited picture display time will cause the decoder to crash because the VLD will fail to extract all of the picture from the rate buffer. This may have devastating consequences for the picture quality, especially if the failed picture happened to be an anchor, which is most likely the case since those types of pictures usually carry most of the information. It the failed picture is an anchor, the error will propagate into several other pictures, thus aggravating the degradation problem. As a consequence, the VLD configuration, such as the one described in U.S. Pat. No. 5,173,695, has to operate at the PSR in order to decode HDTV pictures without failure.

Based on the above and foregoing, it can be appreciated that there presently exists a need in the art for a variable length decoder which overcomes the above-discussed drawbacks and shortcomings of the presently available technology, e.g., which can be used to implement a single-VLD HDTV decoder, rather than a partitioned HDTV decoder. More particularly, there presently exists a need in the art for a variable length decoder having a data throughput which is adequate for processing digital video data, but at a lower clock rate, thereby enabling the use of cheaper (slower) memory and making more practical the implementation of the variable length decoder.

To fulfill this need in the art, and increase the data throughput, a variable length decoder capable of pre-tagging the input bit stream and of parallel processing contiguous code words of identical type was developed and disclosed in U.S. Pat. No. 5,668,548 entitled "HIGH PERFORMANCE VARIABLE LENGTH DECODER WITH ENHANCED THROUGHPUT DUE TO TAGGING OF THE INPUT BIT STREAM AND PARALLEL PROCESSING OF CONTIGUOUS CODE WORDS," by M. Bakhmutsky (the present inventor), the disclosure of which is herein incorporated by reference. Although the variable length decoder disclosed in the above-referenced application constitutes an excellent solution for both higher throughput and lower clock rate, the overhead of both the tree-searching pre-tagging circuit and the additional buffer memory of the same size as the rate buffer result in a product cost which may be prohibitive for at least some consumer HDTV decoders. Thus, the cost of this variable length decoder constitutes a shortcoming thereof.

Accordingly, a high performance variable length decoder meeting these stringent requirements for a consumer HDTV decoder was developed and disclosed in U.S. Pat. No. 5,650,905. The throughput per clock cycle of the variable length decoder disclosed in this application is adaptively increased for a selected group of code words in the Huffman encoded input bit stream which have a bit length less than a prescribed number, by decoding combinations of two or more code words from the selected group, during a single clock cycle, using a combination value look-up table. Since the code words in the selected group are the statistically most frequently occuring code words in the Huffman encoded input bit stream, the variable length decoder is able to process an entire picture at a reduced clock rate, without sacrificing throughput.

Thus, improved statistical performance is attained due to adaptive acceleration in processing code words in the selected group. In other words, the VLD disclosed in this application applies parallelism in the processing of the smaller code words in the Huffman Table which actually are the cause of the high PSR.

Although the VLD disclosed in this co-pending application constitutes a low-cost, high-quality VLD, there is room for further optimization and cost reduction, which is the purpose of the present invention.

SUMMARY OF THE INVENTION

The present invention encompasses a variable length decoder with adaptive acceleration in processing of a variable length-encoded (Huffman encoded) input bit stream which includes an input section which receives the input bit stream and provides a decoding window that includes a sequence of bits which include one or more code words to be decoded at an output thereof.

A code word length decoding section determines the combined length of a combination of two or more code words received from the input section in response to a first value of a control signal and generates a combined length signal representative of the determined combined length, and determines the length of an individual code word received from the input section in response to a second value of the control signal, and generates an individual code word length signal representative of the determined length of the individual code word.

A computation loop section receives the combined length signal or the individual word length signal from the code word length decoding section and, in response thereto, shifts the decoding window to provide a new sequence of bits that include one or more additional code words to be decoded at the output of the input section. A code word value decoding section decodes the values of the combination of two or more code words provided by the input section in response to the first value of the control signal, and decodes the value of the individual code word in response to the second value of the control signal.

A control section generates the control signal and controls the operation of the variable length decoder according to a decoding protocol (e.g., MPEG-2). The two or more code words of the combination of code words are part of a sub-grouped and cross-grouped set of code words of a selected group of M code words in the input bit stream whose bit lengths are ≦than a prescribed number N. Less than all possible combinations of the selected group of M code words are stored as entries in a look-up table, so that the total number of combinations of the selected group of M code words which are stored as entries in the look-up table is less than $M^2$, which not only reduces the complexity of the look-up table circuitry, but due to the logic reduction, allows the use of higher clock rates for applications which demand higher throughput.

The selected group of M code words are preferably sub-grouped into at least two sub-groups of code words according to the bit length of the code words. The sub-groups of code words are preferably cross-grouped in such a manner that only those combinations of code words from the sub-groups which are necessary to maintain a prescribed average minimum bit length per code word for a given clock rate are stored as entries in the look-up table.

In the disclosed embodiment, the selected group of M code words are sub-grouped into two sub-groups of code words, including a first sub-group S1 of code words whose bit length is between A and B, and a second sub-group S2 of code words whose bit length is between X and N. Preferably, A is the shortest bit length of the code words in the selected group of M code words, X=B+1,LMIN is a prescribed average minimum bit length per code, and the code words in the sub-groups S1 and S2 are cross-grouped so that only combinations of the code words from the sub-groups S1 and S2 which are necessary to ensure that LMIN is realized are stored as entries in the look-up table, whereby all combinations of the code words from the sub-groups S1 and S2 which could be processed without cross-grouping while still maintaining LMIN are omitted from the look-up table.

BRIEF DESCRIPTION OF THE DRAWINGS

These and other objects, features, and advantages of the present invention will be readily understood from the following detailed description read in conjunction with the accompanying drawings, in which:

FIGS. 1–6 illustrate a method of sub-grouping and cross-grouping the DCT coefficients for $4 \leq N \leq 9$ and associated $3.5 \leq LMIN \leq 6$, in accordance with a preferred embodiment of the present invention;

DETAILED DESCRIPTION OF THE INVENTION

Figure 1:
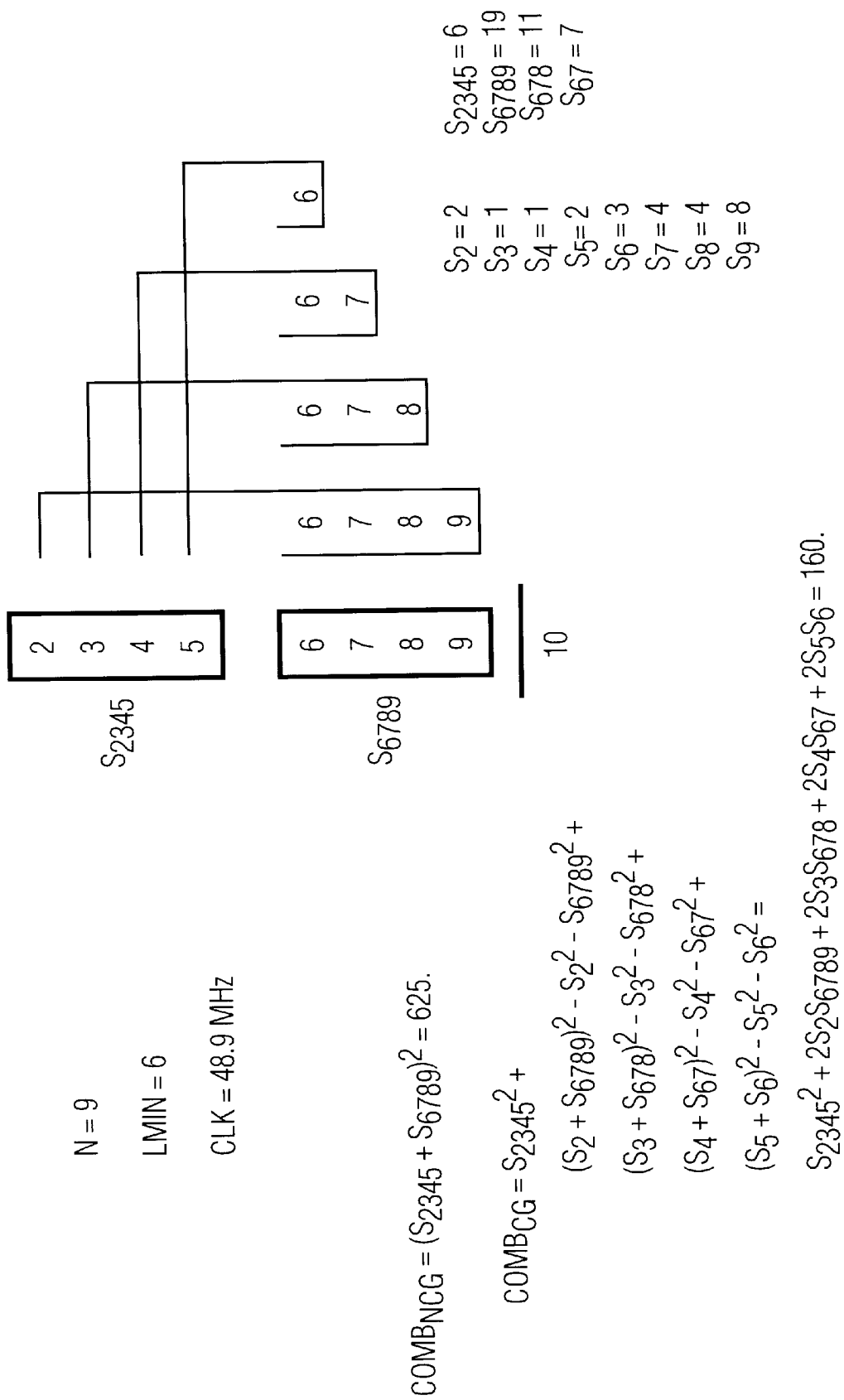
Figure 2:
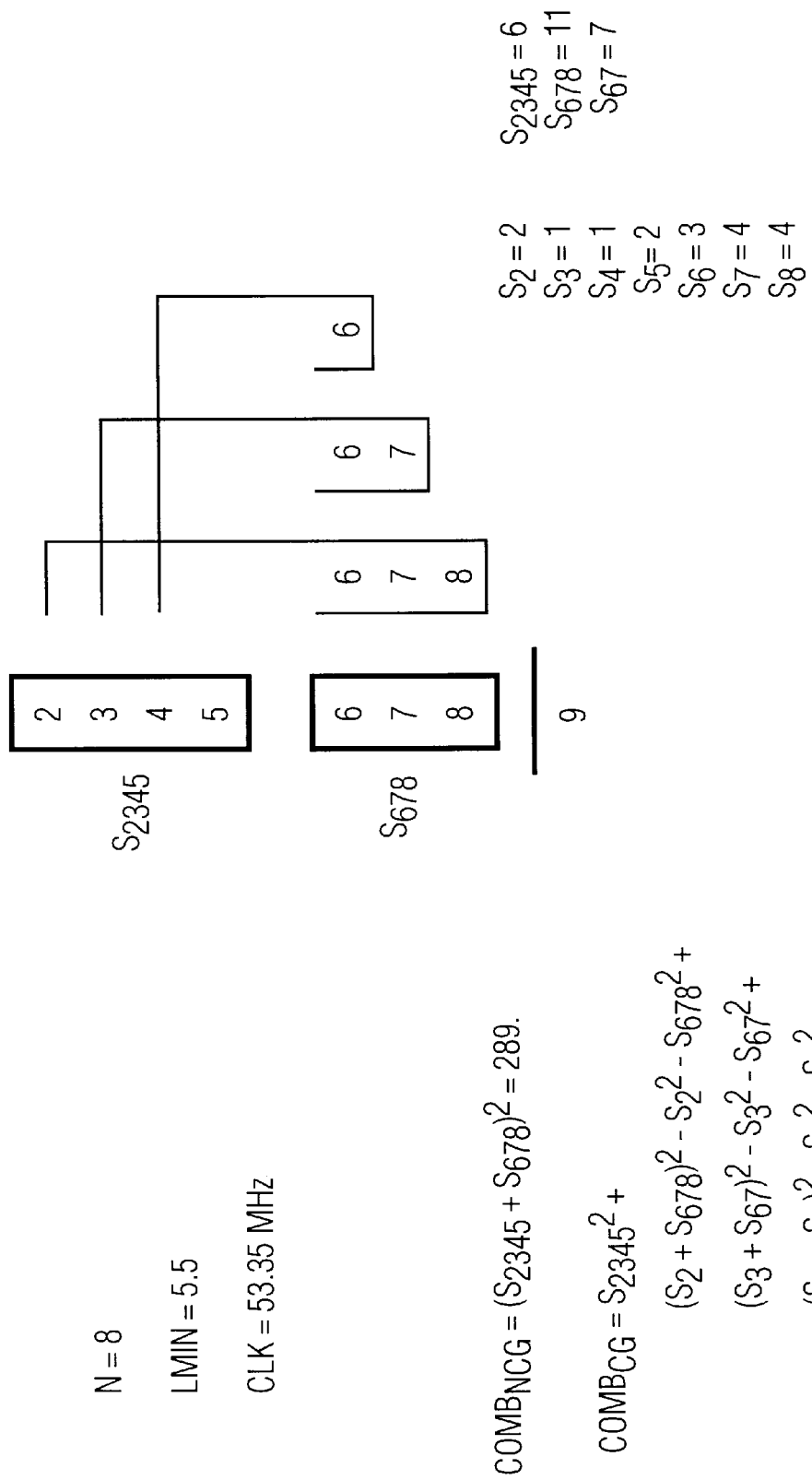
Figure 3:
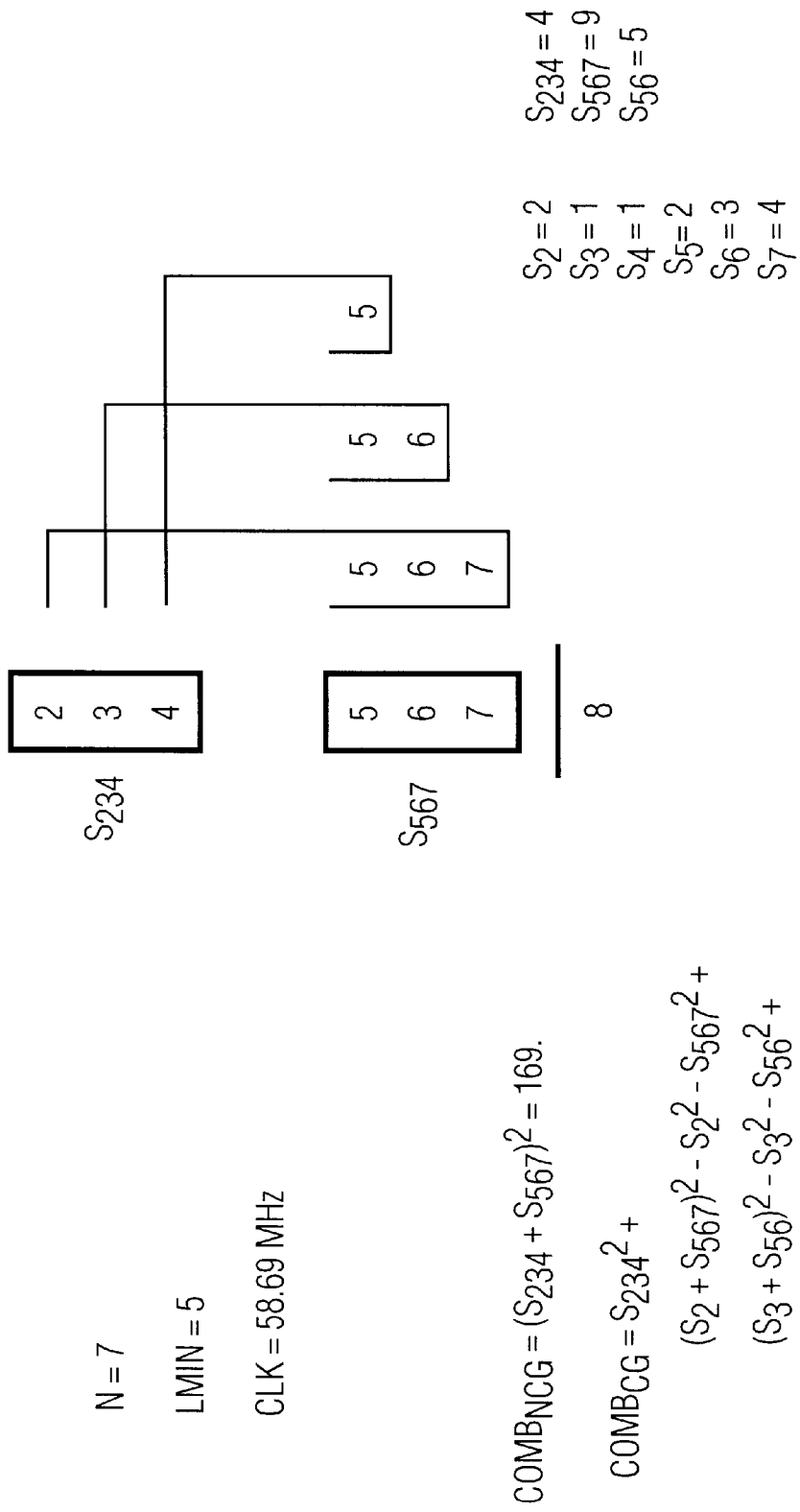
Figure 4:
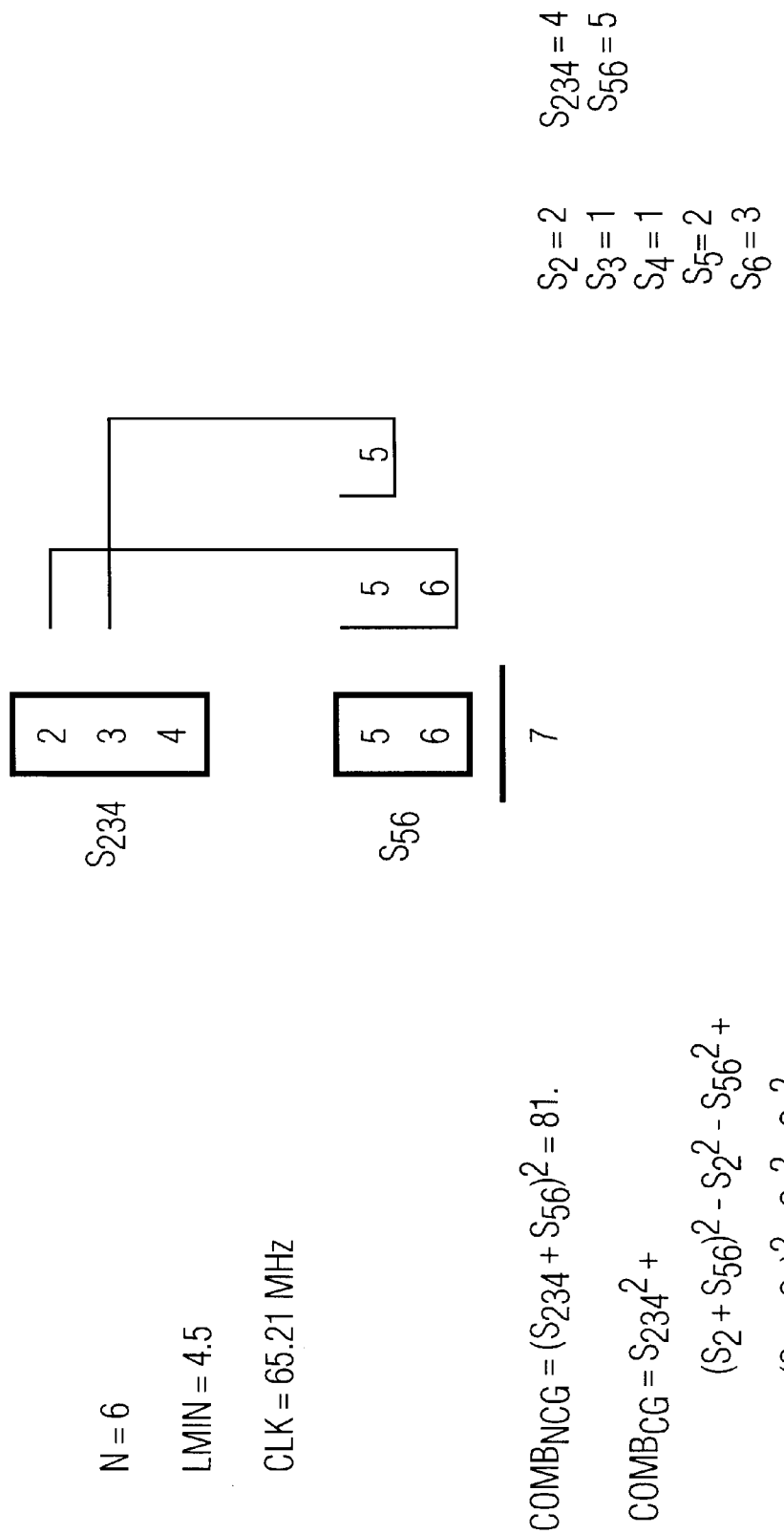
Figure 5:
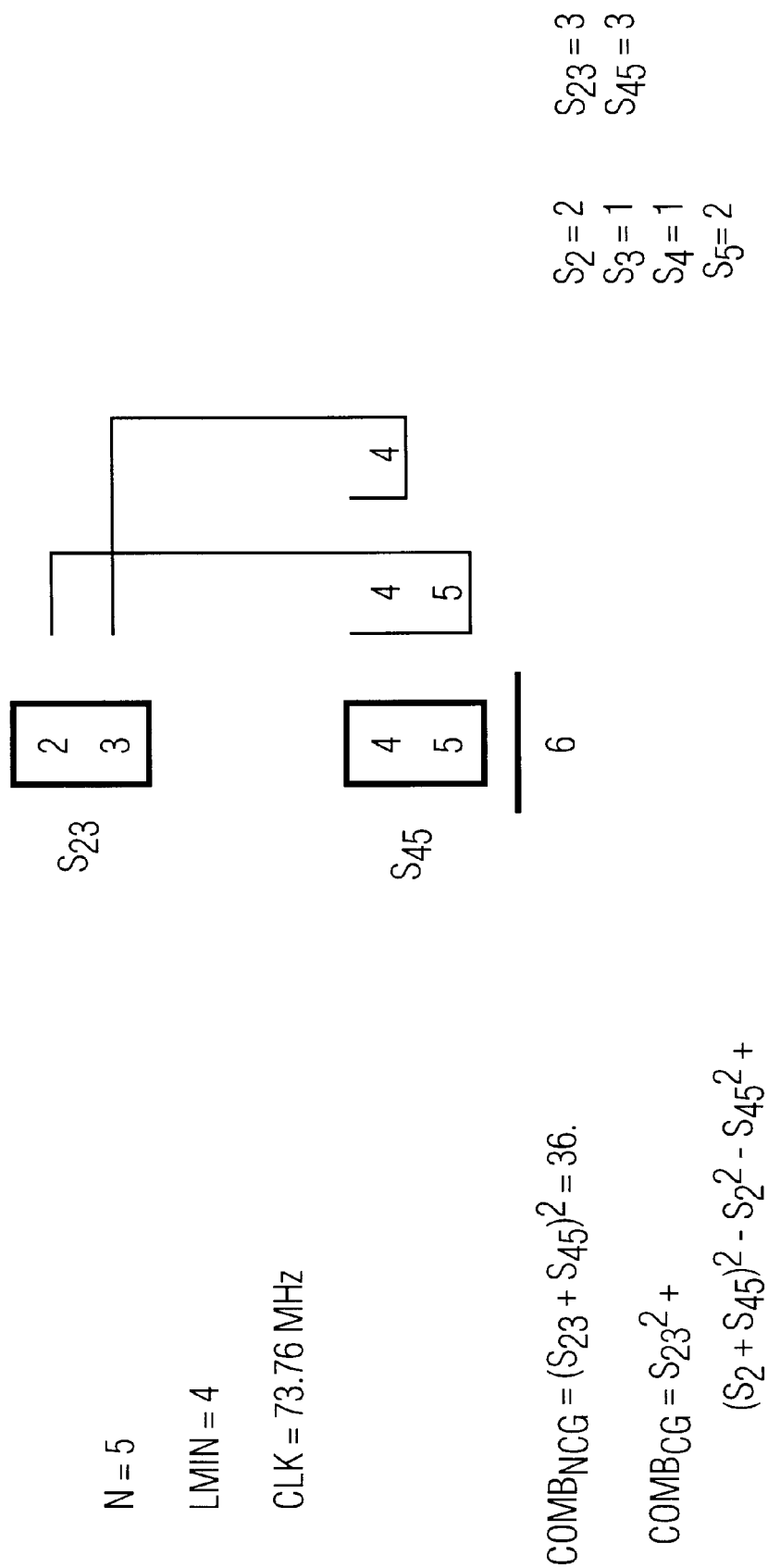
Figure 7:
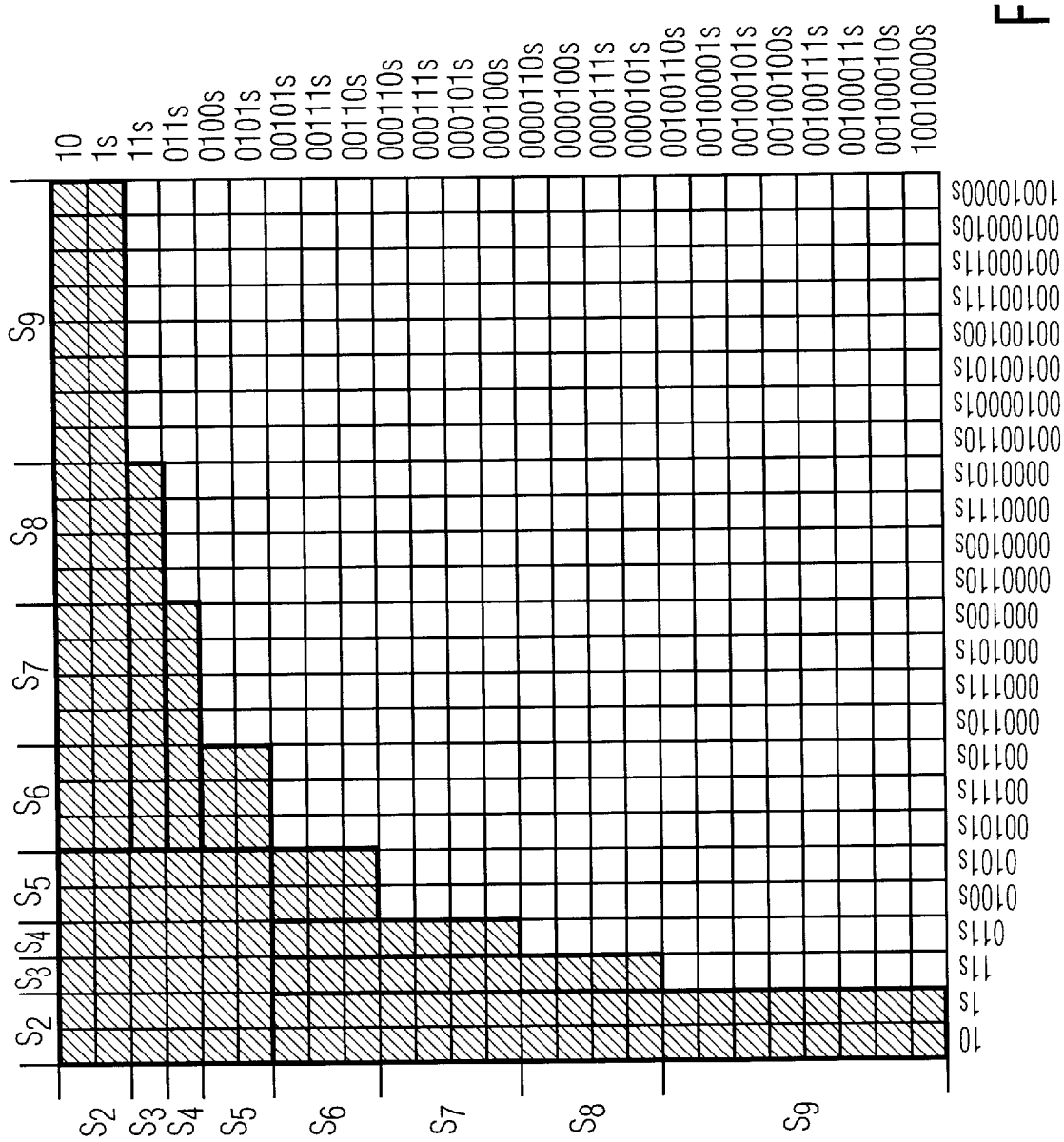
FIGS. 7–12 are matrix representations of the accelerated code combinations used for each of the schemes of sub-grouping and cross-grouping the DCT coefficients for $4 \leq N \leq 9$ and associated $3.5 \leq LMIN \leq 6$, in accordance with a preferred embodiment of the present invention; and, FIG. 13 is a block diagram of a VLD which is preferably utilized to implement the above-described method of the present invention.
Figure 8:
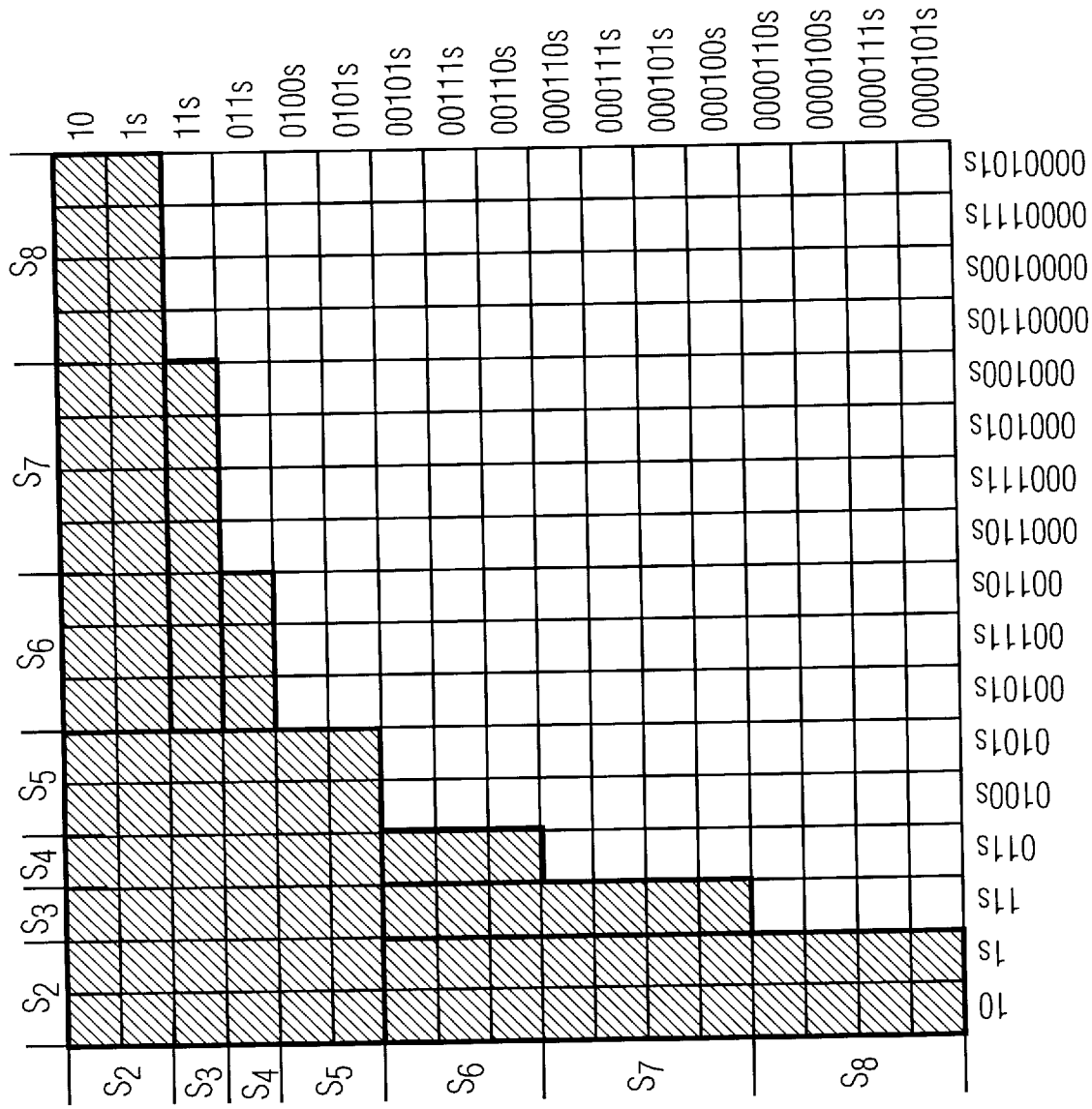
Figure 9:
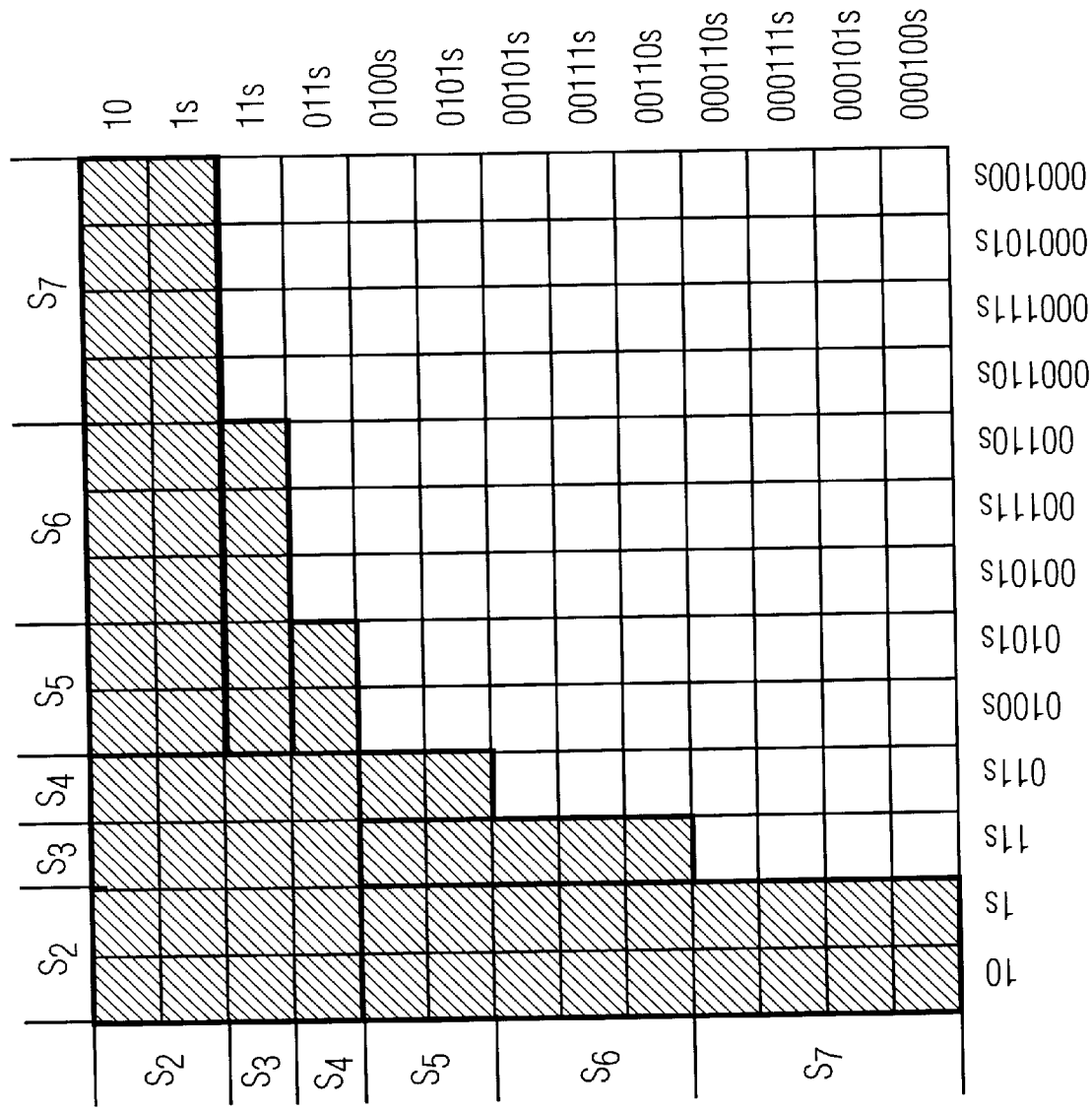
Figure 10:
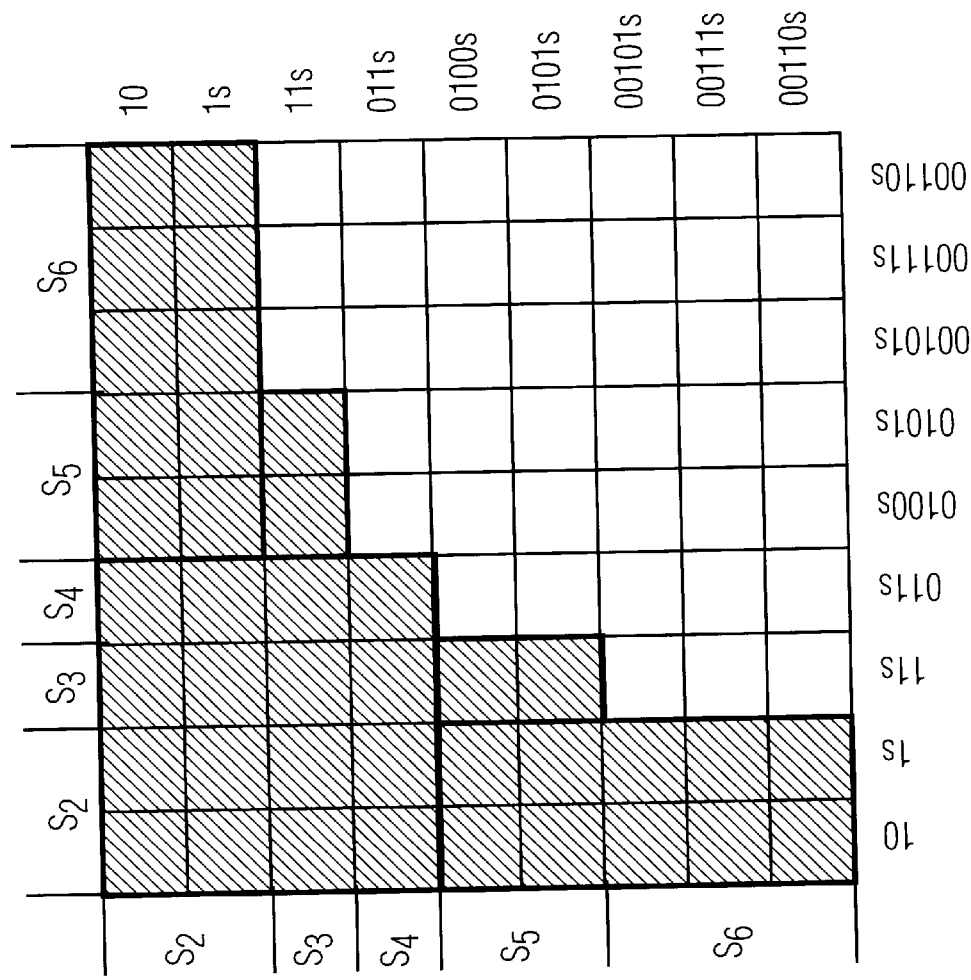
Figure 11:
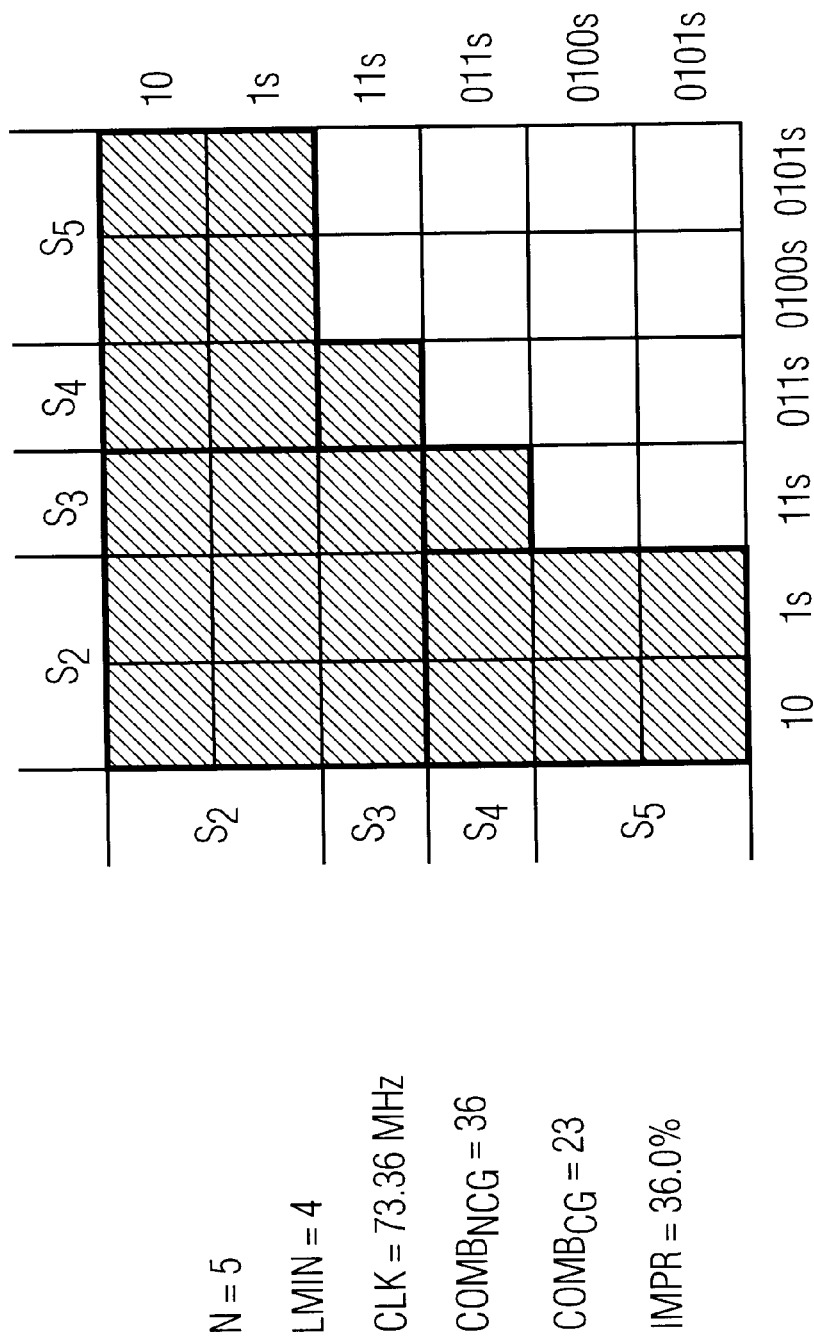
Figure 12:
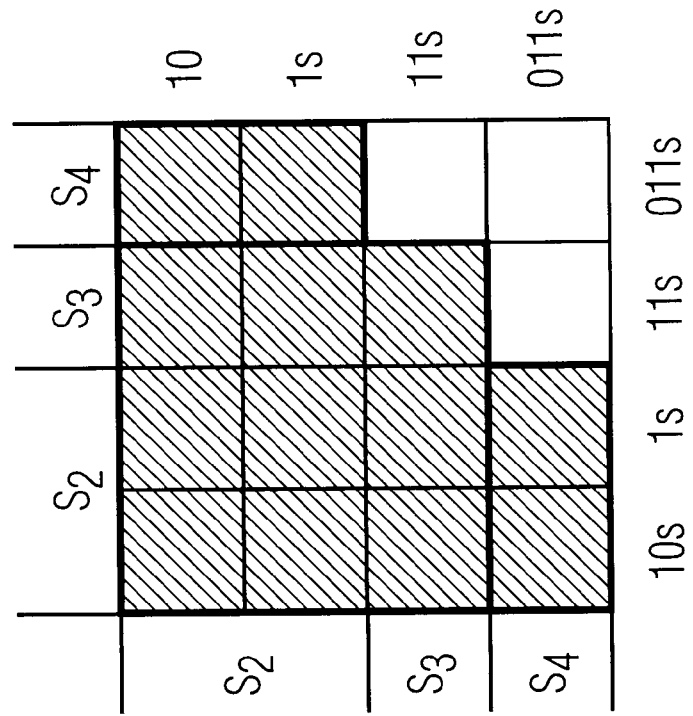

While the present invention is described herein with reference to illustrative embodiments for particular applications, it should be understood that the present invention is not limited thereto. Those having ordinary skill in the pertinent art and access to the teachings provided herein will recognize additional modifications, applications, and embodiments within the scope thereof and additional fields in which the present invention would be of significant utility.

In U.S. Pat. No. 5,650,905, the problem of high PSRs is resolved by selectively applying paraellel processing to a small group of DCT coefficients of the smallest bit length. The goal is a system that will guarantee a higher effective minimum bit length per symbol, LMIN, which, in turn, will produce a lower resulting peak symbol rate PSR and, therefore, a lower clock rate CLK sufficient to process the entire picture at a frame rate F (e.g., 30 frames/second).

The Huffman look-up for DCT coefficients starts with the symbols of highest probability of occurrence. Symbols with the highest probability of occurrence have the lowest bit length. The bit length grows fast in the beginning of the table because the number of possibilities for branching is very limited. In accordance with the disclosure of U.S. Pat. No. 5,668,458, code words within a group of M symbols which do not exceed a specified bit length N are combined in pairs in a combination look-up table. An additional entry is made in the Huffman look-up table for every possible combination of the M symbols. In total, $M^2$ additions are made to the Huffman look-up table. If N is kept relatively small, then $M^2$ (i.e., the number of these additional combinations) is relatively small. As the specified number of bits N increases, so does M. However, the speed of the variable length decoder increases as N increases, since more code words on average are processed per clock cycle.

By applying parallelism in the processing of selected groups of code words in the Huffman encoded bit stream, the variable length decoder (VLD) disclosed in U.S. Pat. No. 5,650,905 accelerates the processing of smaller code words in the Huffman encoded bit stream. Without this parallelism in the processing of selected groups of code words, the occurrence of many small code words in the Huffman encoded bit stream (those that statistically have the highest probability of occurrence in the Huffman encoded bit stream) increases the peak code word (symbol) rate PSR for a particular picture, and therefore, increases the rate CLK at which the variable length decoder needs to be clocked. By adding the combination entries to the conventional Huffman look-up table, the processing of two or more small code words together in one clock cycle becomes possible. By processing the small code words in the selected group of M code words (symbols) together, a reduced clock rate CLK becomes possible, while maintaining the same throughput.

Statistically, this approach sharply improves the VLD performance because all of the high-probability coefficients are processed with double throughput. In order to guarantee the performance of such a VLD for processing the worst case picture (i.e., highest PSR), the clock rate CLK would have to be high enough to guarantee processing of all DCT coefficients in a worst case picture. However, due to the guaranteed higher LMIN (effective minimum bit length per symbol), the clock rate CLK can still be dramatically reduced vis-a-vis the conventional VLD. More particularly, the operating parameters can be derived as follows:

LMIN=(N+3)/2 (for the specific case in which the shortest bit length A of a symbol in the selected group of M symbols is 2 bits, as in the preferred embodiment - - more generally, however, LMIN=(N+1+A)/A); and, $$CLK=(B/LMIN)*F=(2*B/(N+3))*F, \qquad (1)$$

where B is the rate buffer size in bits and F is the frame rate in Hz.

In accordance with the MPEG-2 protocol as set forth in "Generic Coding of Moving Pictures and Associated Audio Information: Video," MPEG Committee International Standard, ISO/IEC 13818-2, ISO/MPEG, Nov. 9, 1994, the smallest DCT coefficient has a length of two bits. The Huffman look-up table has entries of bit length 2 and higher as follows:

|  | Symbol Bit Length |
|---|---|
|  | 2 |
|  | 3 |
|  | 4 |
|  | 5 |
|  | . |
| M symbols | N − 1 |
| of length 2 to N | N |
|  | N + 1 |
|  | . |
|  | . |

In U.S. Pat. No. 5,650,905, it is demonstrated that none of the combinations in the selected group of M symbols can produce the PSR and that the worst case picture which is possible is the one constructed of the sequence of the shortest symbols in the group of M symbols and the shortest symbols of the next group of symbols (i.e., those symbols with a bit length of N+1, i.e., the sequence 2, N+1,2,N+1, 2,N+1,2,N+1,etc.). The combinations of the symbols of bit length 2 among themselves and with any other symbols are possible but not important because these symbols can occur only at the DCT block boundary. Nevertheless, symbols of bit length 2 are considered for the worst case calculations.

To achieve the guaranteed performance results in U.S. Pat. No. 5,650,905, $M^2$ additional entries are made in the Huffman look-up table. Since M grows faster with every new increment of N by 1 in the Huffman look-up table, it is quite desirable to keep the number of combinations as low as possible so that the implementation of this technique remains practical.

The purpose of the present invention is to obtain identical results using less DCT coefficient combinations by first sub-grouping the M symbols of bit length up to N and then cross-grouping certain DCT coefficients belonging to different sub-groups. This concept is illustrated in FIG. 1 for N=9 and LMIN=(N+3)/2=6. As can be seen there, two sub-groups ($S_{2345}$ and $S_{6789}$) are created within the original group of M symbols. The sub-group $S_{2345}$ of symbols encompasses the DCT coefficients of bit length 2 through 5. The sub-group $S_{6789}$ of symbols encompasses the DCT coefficients of bit length 6 through 9, where N=9. The total number of symbols in the two sub-groups $S_{2345}+S_{6789}=M$.

The sub-grouping is done in such a way that the sub-group $S_{6789}$ of symbols having a bit length equal to or greater than the desired LMIN=6 are separated. Combining these symbols among themselves is not required in order to guarantee LMIN=6 for this example.

In the upper sub-group $S_{2345}$ of symbols, all of these symbols must be combined to guarantee LMIN=6 (except the combinations where 2-bit symbols are involved). In grouping two symbols, the guaranteed LMIN over the picture cannot actually exceed 6. This is true because the acceleration effects of grouping the two essential shortest possible symbols of bit length 3 has an inherent limit of 2×3=6 bits per clock cycle. For this reason, even accounting for combining the 2-bit symbols with the out-of-group shortest symbols:

$$LMIN=(N+3)/2 \leq 6, \text{ and } N \leq 9, \qquad (2)$$

which means that increasing N above this limit will not bring further guaranteed improvement in the VLD throughput and can only introduce statistical throughput enhancement.

If the two sub-groups $S_{2345}$ ("upper sub-group") and $S_{6789}$ ("lower sub-group") are cross-grouped, the resulting LMIN for the entire group of M symbols will still be defined by equation (2).

The optimal cross-grouping of the sub-groups $S_{2345}$ and $S_{6789}$ is the cross-grouping which yields the smallest number of combinations. The goal is to exclude the cross-group combinations of symbols which, if processed separately, would not exceed the desired LMIN=6 averaged over two cycles of the clock CLK.

More particularly, the symbols $S_2$ of bit length 2 are combined with all $S_{6789}$ symbols of the lower sub-group. The $S_2$ symbols need not be combined with symbols which have a bit length of 10 or greater, because such combinations will produce LMIN=(2+10)/2=6 bits per symbol without cross-grouping, in the worst case. The symbols $S_3$ of bit length 3 are only cross-grouped with the $S_{6789}$ symbols of bit length 6 through 8. The $S_3$ symbols need not be combined with symbols which have a bit length of 9 or greater, because such combinations will produce LMIN=(3+9)/2=6 bits per symbol without cross-grouping, in the worst case. The symbols $S_4$ of bit length 4 are only cross-grouped with the $S_{67}$ symbols of bit length 6 through 7. The $S_4$ symbols need not be combined with symbols which have a bit length of 8 or greater, because such combinations will produce LMIN= (4+8)/2=6 bits per symbol without cross-grouping, in the worst case. The symbols $S_5$ of bit length 5 are only cross-grouped with the $S_6$ symbols of bit length 6. The $S_5$ symbols need not be combined with symbols which have a bit length of 7 or greater, because such combinations will produce LMIN=(5+7)/2=6 bits per symbol without cross-grouping, in the worst case.

The number of symbol combinations resulting from such cross-grouping $COMB_{CG}$ can be calculated in accordance with the following equation (3):

$$COMB_{CG} = S_{2345}^2 + (S_2 + S_{6789})^2 - S_2^2 - S_{6789}^2 + \qquad (3)$$
$$(S_3 + S_{678})^2 - S_3^2 - S_{678}^2 + (S_4 + S_{67})^2 -$$
$$S_4^2 - S_{67}^2 + (S_5 + S_6)^2 - S_5 - S_6 = S_{2345}^2 +$$
$$2S_2S_{6789} + 2S_3S_{678} + 2S_4S_{67} + 2S_5S_6.$$

In this equation (3), $S_{2345}^2$ is the number of combinations among $S_{2345}$ symbols in the upper sub-group. All of the symbols of this sub-group must be combined since their bit length is less than 6. The total number of symbol combinations $COMB_{CG}$ is significantly smaller than the number of combinations $COMB_{NCG}$ among $M=S_{2345}+S_{6789}$ symbols without cross-grouping, as in U.S. Pat. No. 5,650,905. This number can be derived from the following equation (4):

$$COMB_{NCG}=M^2=(S_{2345}+S_{6789})^2=S_{2345}^2+2S_{2345}S_{6789}+S_{6789}^2. \qquad (4)$$

The schemes of sub-grouping and cross-grouping the DCT coefficients for $4 \leq N \leq 9$ and associated $3.5 \leq LMIN \leq 6$ are presented in FIGS. 1–6. The associated calculations for the number of symbol combinations assume that the look-up table is the MPEG-2 DCT Coefficient Table Zero. The beginning of this table listing variable length codes for DCT coefficients of length up to 9 bits is provided in the following Table 1 for illustration purposes. In this table, "s" is a sign bit which does not increase the number of symbol combinations for the purposes of symbol grouping.

TABLE 1

| Variable Length Code | Meaning |
| --- | --- |
| 10 | End of Block |
| 1s | First (DC) Coefficient in the Block |
| 11s | Next (AC) Coefficient in the Block |
| 011s | Next (AC) Coefficient in the Block |
| 0100s | Next (AC) Coefficient in the Block |
| 0101s | Next (AC) Coefficient in the Block |
| 0010 1s | Next (AC) Coefficient in the Block |
| 0011 1s | Next (AC) Coefficient in the Block |
| 0011 0s | Next (AC) Coefficient in the Block |
| 0001 10s | Next (AC) Coefficient in the Block |
| 0001 11s | Next (AC) Coefficient in the Block |
| 0001 01s | Next (AC) Coefficient in the Block |
| 0001 00s | Next (AC) Coefficient in the Block |
| 0000 110s | Next (AC) Coefficient in the Block |
| 0000 100s | Next (AC) Coefficient in the Block |
| 0000 111s | Next (AC) Coefficient in the Block |
| 0000 101s | Next (AC) Coefficient in the Block |
| 0010 0110s | Next (AC) Coefficient in the Block |
| 0010 0001s | Next (AC) Coefficient in the Block |
| 0010 0101s | Next (AC) Coefficient in the Block |
| 0010 0100s | Next (AC) Coefficient in the Block |
| 0010 0111s | Next (AC) Coefficient in the Block |
| 0010 0011s | Next (AC) Coefficient in the Block |
| 0010 0010s | Next (AC) Coefficient in the Block |
| 0010 0000s | Next (AC) Coefficient in the Block |

The reduced clock rate CLK that would guarantee processing of all DCT coefficients in the worst case picture due to the guaranteed higher LMIN is derived from equation (1) above for an MPEG-2 Main Profile, High Level compliant HDTV Decoder for rate buffer size B=9,781,248 bits and frame rate F=30 pictures per second.

The matrix representations of the accelerated code combinations used for each of the schemes of sub-grouping and cross-grouping the DCT coefficients for $4 \leq N \leq 9$ and associated $3.5 \leq LMIN \leq 6$ are presented in FIGS. 7–12. The shaded areas represent the active code combinations, while the blank areas represent the code combinations that are excluded. The solid lines outline the lower sub-group and halves of the involved cross-groups. The improvement factor IMPR is calculated as a percentage ratio of the blank area to the total area of the matrix in accordance with the following equation (5):

$$IMPR = ((COMB_{NCG} - COMB_{CG})/COMB_{NCG}) * 100\%. \quad (5)$$

Table 2 below provides a comparison of performance and required resources between the method of adaptive acceleration in processing of Huffman encoded bit streams disclosed herein and the one disclosed in U.S. Pat. No. 5,650,905.

TABLE 2

| N(bits) | LMIN (bits) | CLK (MHZ) | COMB$_{NCG}$ | COMB$_{CG}$ | Improvement (%) |
|---|---|---|---|---|---|
| 9 | 6.0 | 48.90 | 625 | 160 | 74.4 |
| 8 | 5.5 | 53.35 | 289 | 100 | 65.4 |
| 7 | 5.0 | 58.69 | 169 | 66 | 60.9 |
| 6 | 4.5 | 65.21 | 81 | 40 | 50.6 |
| 5 | 4.0 | 73.36 | 36 | 23 | 36.0 |
| 4 | 3.5 | 83.84 | 16 | 13 | 18.8 |

As in U.S. Pat. No. 5,650,905, these numbers assume that none of the most probable accelerated combinations have ever been encountered in the absolute worst case picture. Statistically, of course, the gain in performance is much greater. Such significant reduction in both the processing clock rate and hardware resources makes the VLSI implementation of the VLD more feasible. Further, the reduction in logic utilization enables the VLD to be operated at higher physical clock rates, e.g., for applications such as studio 4—4—4 and 4-2—2 which demand higher throughput. Thus, the present invention can be utilized to reduce the VLD clock rate while maintaining the same VLD throughput, or to increase the VLD clock rate in order to increase VLD throughput for applications which demand such increased throughput capability.

Figure 13:
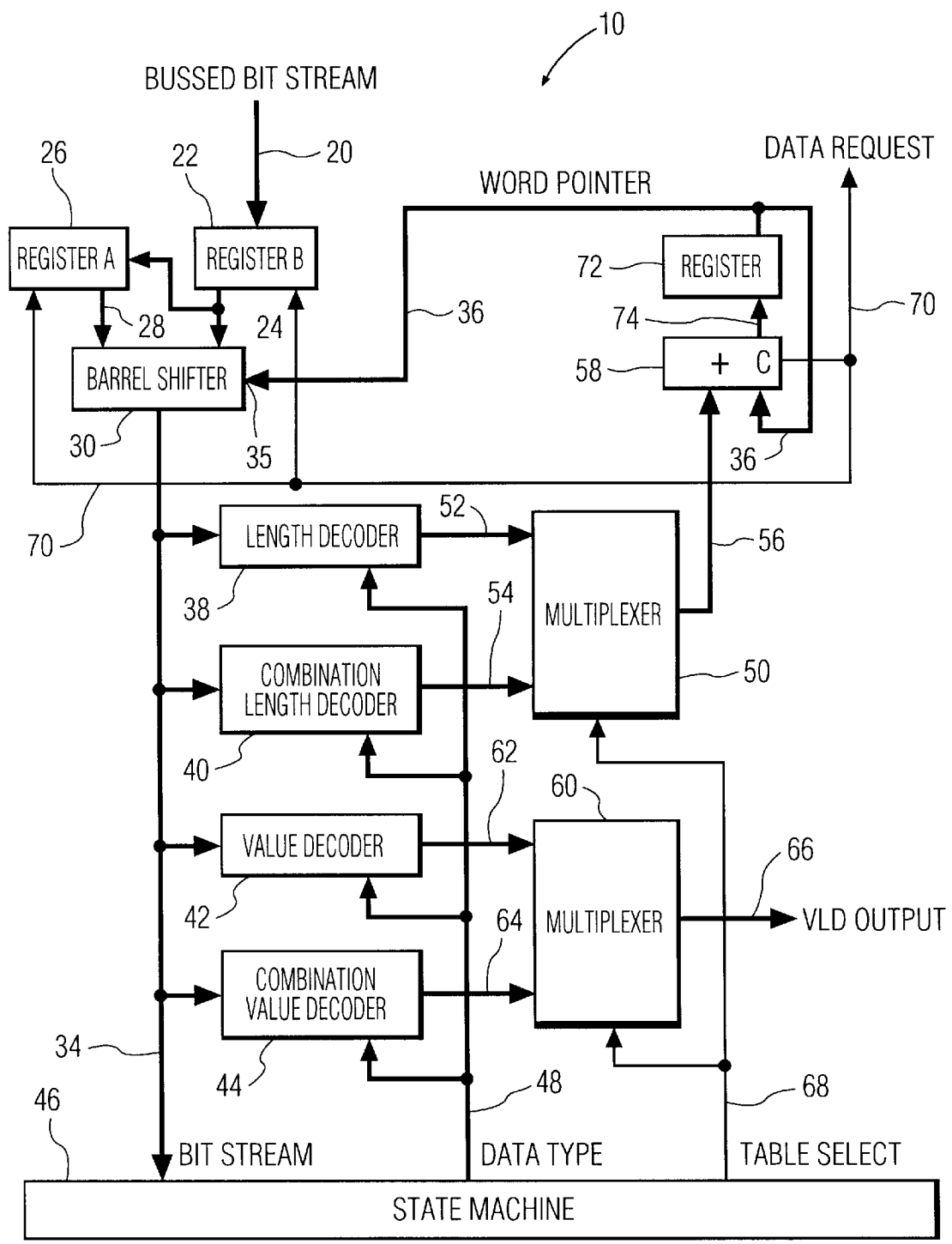

With reference now to FIG. 13, there can be seen a block diagram of a VLD 10 which is preferably utilized to implement the above-described method of the present invention. It will be appreciated that the architecture of the VLD 10 is identical to that of the VLD disclosed in the '407 application. The construction and operation of the VLD 10 is described below for the sake of convenience and ease of reference.

More particularly, an input bit stream 20 contains code words to be decoded. In the present embodiment, the input bit stream 20 is a Huffman encoded bit stream. As previously described, in Huffman encoded bit streams, the code words which have the highest probability of occurence have the smallest number of bits, and the code words which have the lowest probability of occurence have the greatest number of bits. Thus, Huffman encoded bit streams contain code words whose bit length is a function of the probability of occurence of the code word in the bit stream.

A first register 22 is connected to a barrel shifter 30 via thirty-two (32) parallel input bit lines 24, each line corresponding to a bit in the first register 22. A second register 26 is connected to the barrel shifter 30 via thirty-two (32) parallel input bit lines 28, each line corresponding to a bit in the second register 26. Thus, a total of sixty-four (64) parallel input bit lines 24, 28 are connected to the barrel shifter 30, thereby providing a corresponding sequence of sixty-four (64) available input bits for the barrel shifter 30. The barrel shifter 30 has a shift input 35 and thirty-two (32) parallel output bit lines 34. Those skilled in the art will appreciate that other numbers of parallel input bit lines 24, 28 and parallel output bit lines 34 may be utilized without departing from the spirit and scope of the present invention. In the present specific embodiment, the number of parallel input bit lines 24, the number of parallel input bit lines 28, and the number of parallel output bit lines 34 are each chosen to be equal in number to the maximum number of bits in a code word (i.e., maximum code word length).

Initially, in response to a data request signal applied over the line 70, a sequence of thirty-two bits representing code words to be decoded is loaded into the first register 22 from the input bit stream 20. Once the first register 22 is loaded with bits, the contents of the first register 22 are transferred to the second register 26 over thirty-two (32) parallel bit lines 24, and the next sequence of thirty-two bits from the input bit stream 20 is loaded into the first register 22. Thus, a sequence of sixty-four input bits is available to the barrel shifter 30. The thirty-two parallel output bit lines 34 are chosen from the sixty-four parallel input bit lines 24, 28 in a manner discussed below, to thereby provide a decoding window 34. The decoding window 34 is shifted from left to right across the sequence of available input bits in response to a word pointer applied over a line 36 to the shift input 35 of the barrel shifter 30. The decoding window 34 is shifted by the word pointer across the sequence of available input bits according to the length (or combined length) of the code word(s) decoded during a previous clock cycle, so that the start of a next code word(s) to be processed during the current clock cycle begins at the left edge of the decoding window 34.

The value of the word pointer is summed by an adder 58 with the decoded length or combined length(s) of the code word(s) decoded during a current clock cycle. The output of the adder 58 is loaded into a register 72, the output of which is the word pointer. (Of course, when the system is initialized, the register 72 is initialized to zero.) When the sum of the current value of the word pointer plus the decoded length or combined length(s) of the code word(s) decoded during the current clock cycle (hereinafter referred to as the "loop sum") exceeds the bit width of the decoding window 34 (i.e., thirty-two in the present specific embodiment), the adder 58 overflows or loops around "0", and generates a carry output "C" which is applied to the data request line 70, thus triggering a "data reload" operation, in which the contents of the first register 22 are transferred to the second register 26, and the next sequence of thirty-two bits from the input bit stream 20 are loaded into the first register 22. When the adder 58 overflows, the output value of the adder 58 is equal to the amount by which the "loop sum" exceeds thirty-two (i.e., "loop sum" minus 32). Thus, the word pointer shifts the left edge of the decoding window 34 to the input bit equal to this difference. For example, if the "loop sum" is forty, then the output of the adder is eight, and thus, the word pointer will shift the left edge of the decoding window 34 to the eighth available input bit.

The decoding window 34 is input to a length decoder 38, a combination length decoder 40, a value decoder 42, a combination value decoder 44, and a control circuit (state machine) 46. The control circuit 46 detects the code words or groups of code words to be decoded within the decoding window 34, and provides the length decoders 38, 40 and the value decoders 42, 44 with information about the types of code words being processed.

The length decoder 38 has a standard Huffman look-up table for determining the lengths of single code words within the decoding window 34, and the combination length decoder 40 has a look-up table which contains additional entries corresponding to the combinations of code words (symbols) of the group of M symbols sub-grouped and cross-grouped in accordance with the previously described method of the present invention.

The value decoder 42 has a standard Huffman look-up table for determining the values of single code words within the output decoding window 34. The combination value decoder 44 has a look-up table which contains additional entries corresponding to the combinations of code words (symbols) of the group of M symbols sub-grouped and cross-grouped in accordance with the previously described method of the present invention.

Control signals produced by the control circuit 46 are applied to the value decoders 42, 44 over the control lines 48 and 68. The control signals convey information about the types and number of code words to be decoded in a given clock cycle. These control signals are used in a manner described below to select the length decoder 38 and the value decoder 42 for processing a single code word, and to select the combination length decoder 40 and the combination value decoder 44 for processing a combination of two or more code words (symbols) from the sub-grouped and cross-grouped set of code words (symbols) from the original group of M code words having a bit length of $\leq N$, and further, to select the appropriate look-up table for decoding the code word(s) being processed.

The output of the length decoder 38 provides a first multiplexer input 52 to a length multiplexer 50. The output of the combination length decoder 40 provides a second multiplexer input 54 to the length multiplexer 50. The output of the length multiplexer 50 provides a first input 56 to the adder 58. The first input 56 is switched between the first multiplexer input 52 and the second multiplexer input 54 by the length multiplexer 50 in response to the control signal received over the line 68 by the length multiplexer 50 from the control circuit 46, depending upon whether a single code word or a combination of two or more code words (symbols) from the sub-grouped and cross-grouped set of code words (symbols) from the original group of M code words having a bit length of $\leq N$, are being processed.

The output of the value decoder 42 provides a first multiplexer input 62 to a value multiplexer 60. The output of the combination value decoder 44 provides a second multiplexer input 64 to the value multiplexer 60. The output of the value multiplexer 60 is applied over the line 66 as the output of the variable length decoder 10. The output 66 is switched between the first multiplexer input 62 and the second multiplexer input 64 of the value multiplexer 60 in response to the control signal received over the line 68 by the value multiplexer 60 from the control circuit 46.

As previously described, the control circuit 46 determines whether a single code word or combination of two or more code words is to be decoded in a given clock cycle, on the basis of the current and previously decoded code words, in accordance with the decoding protocol. In this regard, the control circuit 46 determines whether the current code word(s) in the Huffman encoded bit stream has (have) a bit length less than the prescribed number, i.e., whether the current code word(s) is (are) in the sub-grouped and cross-grouped set of code words (symbols) from the original group of M code words having a bit length of $\leq N$ to be decoded in combination. If a single code word (i.e., a code word which is not in the sub-grouped and cross-grouped set of code words (symbols) from the original group of M code words having a bit length of $\leq N$) is to be decoded during a given clock cycle, the control circuit 46 selects the first multiplexer input 52 of the length multiplexer 50, and selects the first multiplexer input 62 of the value multiplexer 60, via the control signal applied over the line 68. The decoded length of the single code word is output from the length multiplexer 50, and the decoded value of the single code word is output from the variable length decoder 10 over the output line 66.

If a combination of code words is to be decoded in a given clock cycle, the control circuit 46 selects the second multiplexer input 54 of the length multiplexer 50, and selects the second multiplexer input 64 of the value multiplexer 60 via the control signal applied over the line 68. The combined length of the combination of code words is output from the length multiplexer 50, and the values of the groups of code words are output from the variable length decoder 10 at the output 66.

The first input 56 to the adder 58 is used by the adder 58 and the register 72 to update the word pointer applied over the line 36 to the shift input 35 of the barrel shifter 30. The word pointer is also the second input to the adder 58. The word pointer applied over the line 36 represents the current position of the left edge of the decoding window 34. The adder 58 adds the value of the word pointer to the length (or combined length) of the last decoded code word (or combination of code words). The resulting "loop sum" applied over the line 74 represents the updated value of the word pointer which will be used in the next clock cycle to shift the decoding window 34 across the parallel sequence of available input bits so that the left edge of the decoding window 34 begins a sequence of bits that form the next code word to be decoded. The loop sum applied over the line 74 is stored in the register 72. The output of the register 72, which is the updated (current) word pointer, is coupled to the shift input 35 of the barrel register 30 over the line 36, to thereby shift the decoding window 34 to the next code word to be decoded. The position of the decoding window 34 is shifted every clock cycle with respect to the sequence of available input bits as new code words are decoded.

In the present embodiment, code words within the sub-grouped and cross-grouped set of code words (symbols) from the original group of M code words having a bit length of $\leq N$ are combined in pairs. However, of course, this is not limiting to the present invention.

By applying parallelism in the processing of selected groups of code words in the Huffman encoded bit stream, the variable length decoder 10 of the present invention accelerates the processing of smaller code words in the Huffman encoded bit stream. The occurrence of many small code words in the input bit stream 20 increases the peak code word (symbol) rate for a particular picture, and therefore increases the rate at which the variable length decoder 10 needs to be clocked. By adding additional entries to the conventional Huffman loop-up table, the processing of two or more small code words together in one clock cycle becomes possible. By processing the small code words together, a reduced clock rate is required, and enhanced throughput is obtained.

For illustrative purposes, the present invention is applied to MPEG-2 Main Profile, High Level compliant digital video decoder applications. In such applications, the maximum supported horizontal resolution (H) is 1920 pixels. The maximum supported vertical resolution (V) is 1080 pixels. The non-coefficient data overhead (OVHD) is 0.05.

Although the above description contains many specificities regarding the implementation of the present invention, these should not be construed as limiting the scope of the present invention but as merely providing illustrations of some of the presently preferred embodiments of this invention. For example, the invention is not limited to a particular VLD architecture. In this connection, the "One-Hot" VLD architecture disclosed in U.S. Pat. Nos. 5,657,016 and 08/583,149 (filed Dec. 28, 1995; Bakhmutsky et al) can be employed in the practice of the present invention. In addition, the invention is also not limited to the type of symbols (code words) selected for acceleration. For example, excellent results may be obtained by applying the same optimization technique to the processing of motion vectors.

In general, although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A variable length decoder with adaptive acceleration in processing of a variable length-encoded input bit stream, comprising:

input means for receiving the input bit stream and for providing a decoding window that includes a sequence of bits which include one or more code words to be decoded at an output thereof;

code word length decoding means for determining the combined length of a combination of two or more code words received from said input means in response to a first value of a control signal and for generating a combined length signal representative of the determined combined length, and for determining the length of an individual code word received from said input means in response to a second value of said control signal and for generating an individual code word length signal representative of the determined length of said individual code word;

computation loop means for receiving said combined length signal or said individual word length signal from said code word length decoding means and, in response thereto, shifting said decoding window to provide a new sequence of bits that include one or more additional code words to be decoded at said output of said input means;

code word value decoding means for decoding the values of said combination of two or more code words provided by said input means in response to said first value of said control signal, and for decoding the value of said individual code word in response to said second value of said control signal;

control means for generating said control signal, and controlling the operation of the variable length decoder according to a decoding protocol;

wherein said two or more code words of said combination of code words are part of a sub-grouped and cross-grouped set of code words of a selected group of M code words in said input bit stream whose bit lengths are $\leq$ than a prescribed number N; and, wherein less than all possible combinations of the selected group of M code words are stored as entries in a look-up table, so that the total number of combinations of the selected group of M code words which are stored as entries in the look-up table is less than $M^2$.

2. The variable length decoder as set forth in claim 1, wherein the selected group of M code words are sub-grouped into at least two sub-groups of code words according to the bit length of the code words.

3. The variable length decoder as set forth in claim 2, wherein the sub-groups of code words are cross-grouped in such a manner that only those combinations of code words from the sub-groups which are necessary to maintain a prescribed average minimum bit length per code word for a given clock rate are stored as entries in the look-up table.

4. The variable length decoder as set forth in claim 1, wherein:

the selected group of M code words are sub-grouped into at least two sub-groups of code words, including a first sub-group S1 of code words whose bit length is between A and B, and a second sub-group S2 of code words whose bit length is between X and N;

A is the shortest bit length of the code words in the selected group of M code words, X=B+1, LMIN is a prescribed average minimum bit length per code word; and, the code words in the sub-groups S1 and S2 are cross-grouped so that only combinations of the code words from the sub-groups S1 and S2 which are necessary to ensure that LMIN is realized are stored as entries in the look-up table, whereby all combinations of the code words from the sub-groups S1 and S2 which could be processed without cross-grouping, while still maintaining LMIN, are omitted from the look-up table.

5. The variable length decoder as set forth in claim 4, wherein LMIN=X.

6. The variable length decoder as set forth in claim 4, wherein the code words from the sub-groups S1 and S2 are cross-grouped in such a manner that all combinations of the code words from the sub-groups S1 and S2 which have a combined bit length $\geq$2LMIN are omitted as entries in the look-up table, and only those combinations of code words from the sub-groups S1 and S2 which have a combined bit length <2LMIN are included as entries in the look-up table.

7. The variable length decoder as set forth in claim 4, wherein LMIN=(N+1+A)/A.

8. A variable length decoder with adaptive acceleration in processing of a variable length-encoded input bit stream, comprising:

an input section which receives the input bit stream and provides a decoding window that includes a sequence of bits which include one or more code words to be decoded at an output thereof;

a code word length decoding section which determines the combined length of a combination of two or more code words received from the input section in response to a first value of a control signal and which generates a combined length signal representative of the determined combined length, and which determines the length of an individual code word received from the input section in response to a second value of the control signal and which generates an individual code word length signal representative of the determined length of the individual code word;

a computation loop section which receives the combined length signal or the individual word length signal from the code word length decoding section and, in response thereto, shifts the decoding window to provide a new sequence of bits that include one or more additional code words to be decoded at the output of the input section;

a code word value decoding section which decodes the values of the combination of two or more code words provided by the input section in response to the first value of the control signal, and which decodes the value of the individual code word in response to the second value of the control signal;

a control section which generates the control signal and controls the operation of the variable length decoder according to a decoding protocol;

wherein the two or more code words of the combination of code words are part of a sub-grouped and cross-grouped set of code words of a selected group of M code words in the input bit stream whose bit lengths are $\leq$ than a prescribed number N; and, wherein less than all possible combinations of the selected group of M code words are stored as entries in a look-up table, so that the total number of combinations of the selected group of M code words which are stored as entries in the look-up table is less than $M^2$.

9. The variable length decoder as set forth in claim 8, wherein the selected group of M code words are sub-grouped into at least two sub-groups of code words according to the bit length of the code words.

10. The variable length decoder as set forth in claim 9, wherein the sub-groups of code words are cross-grouped in such a manner that only those combinations of code words from the sub-groups which are necessary to maintain a prescribed average minimum bit length per code word are stored as entries in the look-up table.

11. The variable length decoder as set forth in claim 8, wherein:

the selected group of M code words are sub-grouped into at least two sub-groups of code words, including a first sub-group S1 of code words whose bit length is between A and B, and a second sub-group S2 of code words whose bit length is between X and N;

A is the shortest bit length of the code words in the selected group of M code words, X=B+1, LMIN is a prescribed average minimum bit length per code; and, the code words in the sub-groups S1 and S2 are cross-grouped so that only combinations of the code words from the sub-groups S1 and S2 which are necessary to ensure that LMIN is realized are stored as entries in the look-up table, whereby all combinations of the code words from the sub-groups S1 and S2 which could be processed without cross-grouping, while still maintaining LMIN, are omitted from the look-up table.

12. The variable length decoder as set forth in claim 11, wherein LMIN=X.

13. The variable length decoder as set forth in claim 11, wherein the code words from the sub-groups S1 and S2 are cross-grouped in such a manner that all combinations of the code words from the sub-groups S1 and S2 which have a combined bit length $\geq$2LMIN are omitted as entries in the look-up table, and only those combinations of code words from the sub-groups S1 and S2 which have a combined bit length <2LMIN are included as entries in the look-up table.

14. The variable length decoder as set forth in claim 11, wherein LMIN=(N+1+A)/A.

15. A method of creating a look-up table for a variable length decoder, including the steps of:

sub-grouping a selected group of M code words whose bit lengths are $\leq$N into at least two sub-groups of code words according to the bit lengths of the code words;

cross-grouping the code words from the at least two sub-groups into a set of combined code words each of which has a combined bit length which is greater than or equal to 2LMIN, where LMIN is a prescribed average minimum bit length per code word, and omitting from the set of combined code words combined code words which could be processed by the variable length decoder without such cross-grouping, while still maintaining LMIN; and, storing the set of combined code words as entries in the look-up table.

16. The method as set forth in claim 15, wherein the selected group of M code words are sub-grouped into at least two sub-groups of code words according to the bit length of the code words.

17. The method as set forth in claim 16, wherein the sub-groups of code words are cross-grouped in such a manner that only those combinations of code words from the sub-groups which are necessary to maintain LMIN are stored as entries in the look-up table.

18. The method as set forth in claim 15, wherein:

the selected group of M code words are sub-grouped into at least two sub-groups of code words, including a first sub-group S1 of code words whose bit length is between A and B, and a second sub-group S2 of code words whose bit length is between B+1 and N;

A is the shortest bit length of the code words in the selected group of M code words; and, the code words in the sub-groups S1 and S2 are cross-grouped so that only combinations of the code words from the sub-groups S1 and S2 which are necessary to ensure that LMIN is realized are stored as entries in the look-up table, whereby all combinations of the code words from the sub-groups S1 and S2 which could be processed without cross-grouping, while still maintaining LMIN, are omitted from the look-up table.

19. The method as set forth in claim 18, wherein LMIN=B+1.

20. The method as set forth in claim 18, wherein LMIN=(N+1+A)/A.

* * * * *